United States Patent [19]

Tuttle et al.

[11] Patent Number: 4,511,413

[45] Date of Patent: Apr. 16, 1985

[54] PROCESS FOR FORMING AN IC WAFER WITH BURIED ZENER DIODES

[75] Inventors: Ralph C. Tuttle, Derry, N.H.; Richard S. Payne, Andover, Mass.

[73] Assignee: Analog Devices, Incorporated, Norwood, Mass.

[21] Appl. No.: 539,127

[22] Filed: Oct. 5, 1983

[51] Int. Cl.³ .............................................. H01L 21/22
[52] U.S. Cl. ..................................... 148/187; 148/190
[58] Field of Search ................... 148/187, 190; 357/13

[56] References Cited

U.S. PATENT DOCUMENTS

| | | | |
|---|---|---|---|
| 4,099,998 | 7/1978 | Ferro et al. | 148/187 |
| 4,138,280 | 2/1979 | Rodov | 148/186 |
| 4,177,095 | 12/1979 | Nelson | 148/175 |
| 4,213,806 | 7/1980 | Tsang | 148/187 |
| 4,393,575 | 7/1983 | Dunkley et al. | 148/187 X |
| 4,450,021 | 5/1984 | Batra et al. | 148/187 X |

*Primary Examiner*—G. Ozaki
*Attorney, Agent, or Firm*—Parmelee, Bollinger, Bramblett & Drumm

[57] ABSTRACT

The new process makes it possible to produce stable buried Zener diodes in large-sized wafers where slow ramping of diffusion temperatures is required to avoid crystal damage and other adverse effects. The process includes an initial deep diffusion of p type dopant carried out in two separate steps. In the first step, a diffusion of p dopant is made and is partially driven in. Thereafter, a second diffusion of p dopant is made over the first diffusion and both diffusions are further driven in to the required degree. The Zener diode is completed by still further diffusions including an n dopant diffusion to establish a sub-surface breakdown junction with the first two p dopant diffusions. The first two p dopant diffusions use the same mask window, and preferably are made during the isolation diffusion sequence for the wafer.

5 Claims, 5 Drawing Figures 4,511,413

PROCESS FOR FORMING AN IC WAFER WITH BURIED ZENER DIODES

BACKGROUND OF THE INVENTION

1. Field of the Invention

This invention relates to integrated circuit (IC) wafers of the type including Zener diodes to provide reference voltages. More particularly, this invention relates to forming such a Zener diode wherein the junction breakdown occurs in a sub-surface region in order to insure stable operation.

2. Description of the Prior Art

U.S. Pat. No. 4,213,806, issued to W. K. Tsang on July 22, 1980, describes a method for diffusing wafers so as to form IC chips with Zener diodes having sub-surface breakdown junctions, i.e. so-called buried Zener diodes. The procedure employs a triple diffusion process compatible with conventional bipolar processing. In the first step, a deep p++ diffusion is applied, reaching through the epitaxial layer (Epi) to the buried n+ layer; this deep diffusion is carried out simultaneously with the isolation diffusion for the other components of the wafer. Next, a shallow p+ diffusion is formed over the deep p++ diffusion, and is arranged to extend out laterally well beyond opposite edges of the deep diffusion. This second diffusion is carried out simultaneously with the base diffusion for the wafer. Finally, a shallow n+ diffusion is applied over the p diffusions, to form a sub-surface breakdown junction with the p-doped material, adjacent the central regions thereof, and avoiding breakdown at the surface junction between the n+ and p+ diffusions. This last diffusion is carried out simultaneously with the emitter diffusion for the wafer.

The procedures described in the above Tsang patent have gone into substantial commercial use, and have provided excellent results. However, difficulties have arisen when attempts have been made to apply that procedure to relatively large-sized wafers such as those 4" in diameter. Specifically, it has been found that there is a tendency for the Zener diodes to break down at higher than specified voltages, approaching and often exceeding the break down at surface junctions thus causing potentially unstable performance.

Accordingly, there has developed a need for improved procedures for producing good quality Zener diodes in relatively large-sized wafers.

SUMMARY OF THE INVENTION

It has been found that the difficulties in forming buried Zener diodes by applying known techniques to large-sized wafers are associated with the relatively slow ramping of process temperatures employed with large wafers during the high temperature diffusions. Such slow ramping of temperatures is required to avoid crystal damage and its attendant adverse impact on yield and noise. The slowing of the temperature ramp is quite substantial. For example, with the smaller-sized 2" or possibly 3" wafers, the ramp down of diffusion temperature to room temperature might take 10 minutes or so, whereas for 4" wafers such transition might require in excess of an hour. Such a significantly slowed ramp-down alters the diffusion process markedly. More specifically, it increases the breakdown voltage of n+ p junctions and adversely impacts the window of voltage available for the fabrication of a buried Zener diode.

In accordance with the present invention, such difficulties are avoided by employing a modified procedure for diffusing the Zener diode. More specifically, in the preferred procedure to be described herein, the initial deep diffusion of p type dopant is carried out in two separate steps. In the first step, a diffusion of dopant is made, generally in the usual fashion, and that diffusion is partially driven in. Then, a second diffusion of p dopant is made, and both diffusions then are further driven in to the required degree. These two diffusion steps are identified in the following description as p+(1) and p+(2); they are both carried out using the same window, i.e. the window formed by the normal mask employed for the isolation diffusion for the wafer. After this double set of diffusions and drive-ins is complete, the wafer is further processed generally as described in the above Tsang patent, i.e. it receives a shallow p+ diffusion during the wafer base diffusion, and a shallow n+ diffusion during emitter diffusion. The resulting Zener diodes predominantly achieve sub-surface breakdowns at voltages within a proper design window.

Accordingly, it is an object of the present invention to provide a superior procedure for forming Zener diodes in large-size wafers requiring relatively long temperature ramps. Other objects, aspects and advantages of the invention will in part be pointed out in, and in part apparent from, the following detailed description of a preferred processing procedure, considered together with the accompanying drawings.

BRIEF DESCRIPTION OF THE DRAWINGS

FIG. 2 is a graph showing (only approximately, and not to scale) the diffusion profile for the first deep diffusion (p+(1)) after partial drive-in;

FIG. 3 is a graph showing (only approximately, and not to scale) the diffusion profiles for the first and second deep diffusions (p+(1) and p+(2)) after the second drive-in;

DETAILED DESCRIPTION OF THE PREFERRED EMBODIMENT

Figure 1:
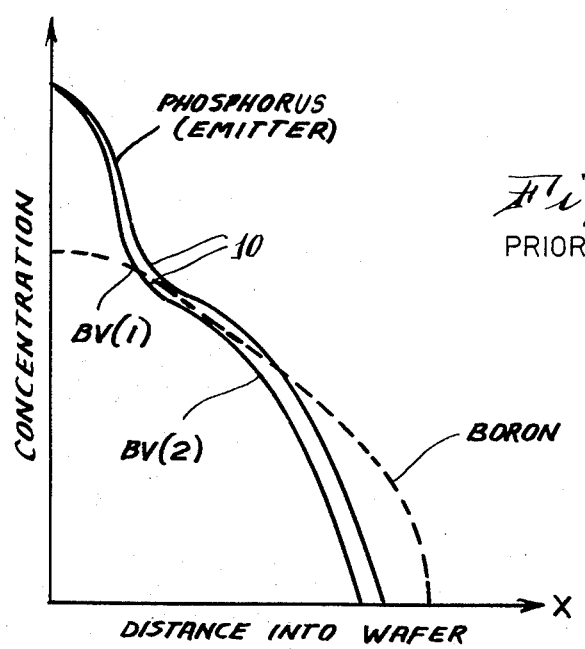
FIG. 1 is a graph presenting typical high-concentration phosphorus diffusion profiles in silicon, together with a typical diffusion profile for boron.

Before describing the invention, a brief discussion of the nature of the problem will first be presented. Referring to FIG. 1, it has been known that the diffusion profile of phosphorus has an unusual characteristic "kink" as indicated at 10. (Two phosphorus curves are shown to indicate how the depth of diffusion can vary as a practical matter.) Moreover, experience with phosphorus diffusions has indicated that this characteristic may be strongly accentuated if relatively long temperature ramps are used to return the wafer to room temperature. Under those circumstances, and with a typical boron diffusion profile as indicated in FIG. 1, it will be seen that the boron curve can be approximately parallel to the phosphorus curve, and close to the phosphorus curve, over a relatively large distance.

Breakdown of the junction occurs at the intersection of the phosphorus and boron curves. For the left-hand phosphorus curve, this will be at BV(1). However, with a slight shift in phosphorus depth, represented by the right-hand curve, the intersection will be at BV(2), representing a significantly higher breakdown voltage. Thus it will be seen that an unacceptably large variation in results can occur. In fact, if the breakdown voltage of the buried pn junction becomes high enough, unstable surface-junction breakdowns will occur instead, i.e. if $BV_{EBO} < BV_Z$ then the breakdown will occur at the surface. Thus the characteristics presented by FIG. 1 represent a serious difficulty with known procedures.

Figure 2:
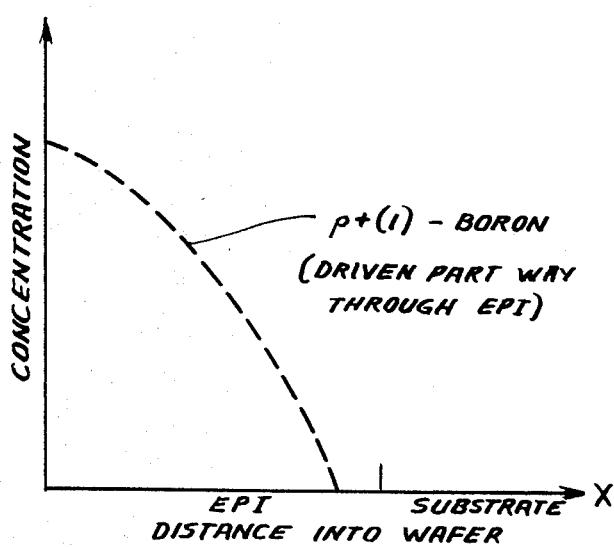

The problem has been solved by specially controlling the diffusion profile of the initial deep p-type diffusion for the wafer. More particularly, this profile is controlled by employing two separate diffusion steps. In the first step, an approximately normal p-type diffusion is made, referred to as p+(1). This diffusion then is partially driven in (as shown by the p+(1) curve in FIG. 2) by application of heat (1200° C.) in the presence of nitrogen and oxygen. The drive-in time in one preferred procedure is about half that used with the single-step deep diffusions previously used with smaller wafers. The p+(1) drive-in, however, reduces the surface concentration of the dopant approximately by an order of magnitude relative to the initial deposition.

Figure 3:
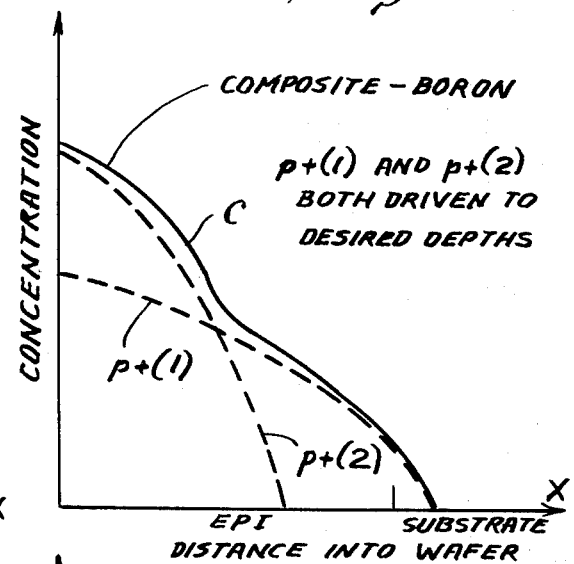

A second p-type diffusion then is made (through the same mask window as the first) to add to the initial deposition. Thereafter, both diffusions are further driven-in by application of heat as before (i.e. at 1200° C.), with results as indicated (qualitatively) in FIG. 3 for both p+(1) and p+(2). FIG. 3 also presents a curve C illustratively representing the composite of p+(1) and p+(2).

After the double-diffusion procedure, the wafer is processed in the normal fashion, as discussed hereinabove. Such processing includes a further but shallow boron diffusion, followed by a phosphorus diffusion simultaneously with formation of emitters on the wafer.

Figure 4:
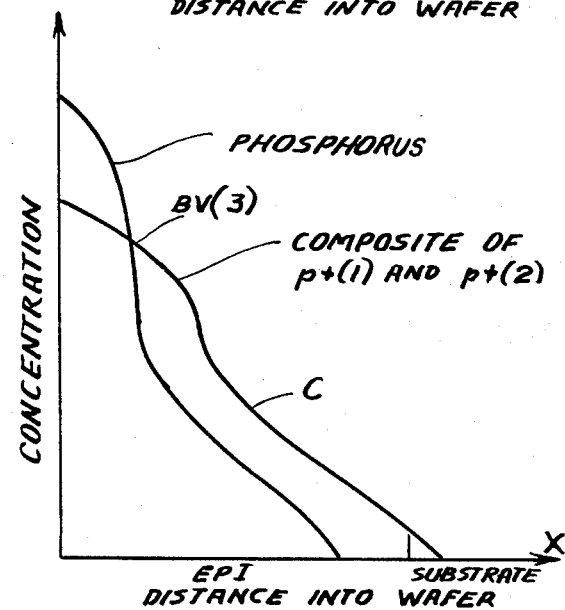
FIG. 4 shows the composite diffusion profile (only approximately, and not to scale) of both the p+(1) and p+(2) diffusions, together with a typical diffusion profile for the phosphorus diffusion.

The resulting diffusion profiles of the boron and phosphorus are pictorially presented in FIG. 4. (It must be emphasized that these presentations and those of the other graphs are not intended to provide precise numerical conditions or relations, but are for illustrating the qualitative nature of the results obtained, to provide an understanding of the principles involved.) It will be seen from FIG. 4 that the intersection point BV(3) between the two curves now occurs in a region where the angle between the curves is relatively large. By using a two-step deep diffusion, excessively high concentrations of boron are avoided. With such a configuration, consistency of results will be achieved even with normal variations in depth of diffusions, and the Zener breakdowns will occur at desirably low voltages with assured sub-surface breakdowns for enhanced stability.

Figure 5:
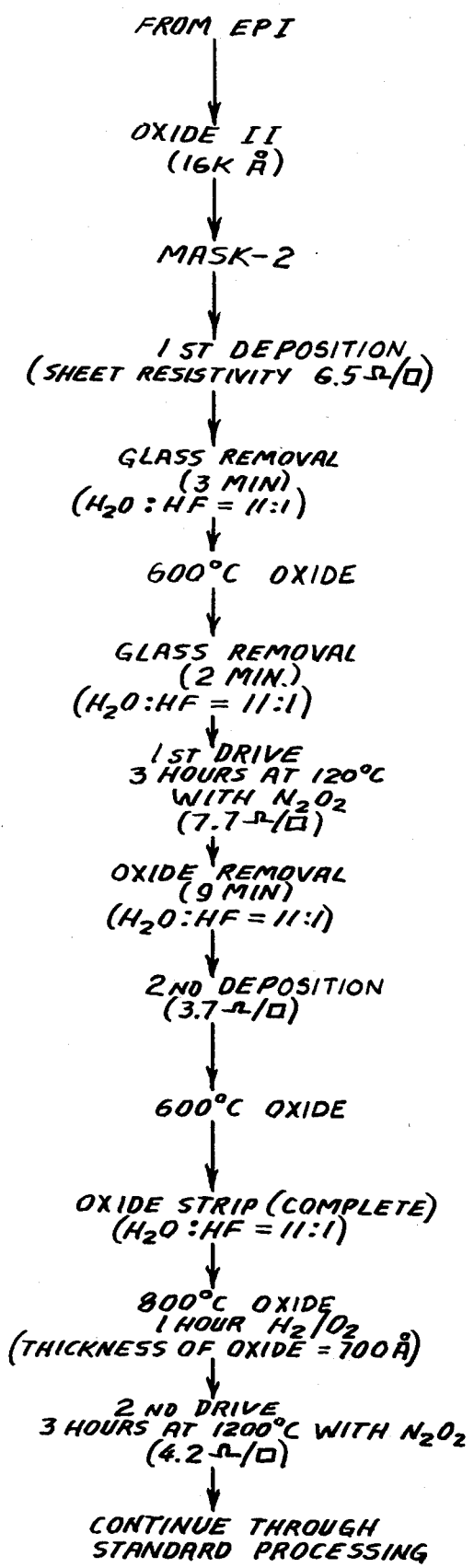
FIG. 5 is a flow chart showing the processing steps in one preferred embodiment of the invention.

FIG. 5 has been included to show the detailed procedural steps carried out in one preferred embodiment of the invention. The procedure starts after the Epi layer has been applied. The steps indicated are individually well known in the art, and thus have been identified only in abbreviated form. After certain of the steps, measurements are made to assure specified values are being maintained. Thus reference is made to sheet resistivity specifications and to thickness of oxide layers (in Angstroms). Glass removal and oxide removal steps are carried out with a water/hydrofluoric acid solution, specified as in a ratio of 11:1 in accordance with known techniques. In this double-diffusion process, the total time of the two drive-in steps should be approximately equal to the duration of the single drive-in step previously used with smaller wafers.

Although a specific preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

What is claimed is:

1. The method of making an IC wafer with a buried Zener diode comprising the steps of:
   making a first p+ diffusion into said wafer;
   driving said first diffusion in;
   making a second p+ diffusion into said wafer over said first diffusion;
   driving said first and second diffusions into said wafer to desired depths;
   making a third p+ diffusion into said wafer over the first and second diffusions, said third diffusion being shallower than said first and second diffusions and extending out laterally beyond opposite edges thereof; and
   making an n+ diffusion in the central region of said p+ diffusions to form a sub-surface breakdown junction with the p-doped material, said n+ diffusion being shallower than said third p+ diffusion.

2. The method of claim 1, wherein said p dopant is boron and said n dopant is phosphorus.

3. The method of claim 1, wherein the same mask window is used for both said first and second p+ diffusions.

4. The method of claim 1, wherein the p+ diffusion is diffused simultaneously in other parts of the wafer for isolation of other devices.

5. The method of claim 1, wherein the n+ diffusion is phosphorus and is diffused simultaneously with the emitter diffusions in other parts of the wafer.

* * * * *